(12) United States Patent
Aiura et al.

(10) Patent No.: US 6,346,901 B1
(45) Date of Patent: Feb. 12, 2002

(54) DIGITAL-TO-ANALOG CONVERSION CIRCUIT

(75) Inventors: Masami Aiura; Yuichi Nakatani; Takashi Kumazaki, all of Sendai (JP)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/470,121

(22) Filed: Dec. 22, 1999

(30) Foreign Application Priority Data

Dec. 24, 1998 (JP) .......................................... 10-366166

(51) Int. Cl.[7] ................................................ H03M 1/80
(52) U.S. Cl. ........................................ 341/153; 341/135
(58) Field of Search ................................ 341/118, 120, 341/143, 155, 61

(56) References Cited

U.S. PATENT DOCUMENTS 4,405,916 A * 9/1983 Hornak et al. ............... 340/347
5,327,134 A * 7/1994 Nakamura et al. .......... 341/144
5,949,362 A * 9/1999 Tesch et al. ................. 341/144

* cited by examiner

*Primary Examiner*—Peguy JeanPierre
*Assistant Examiner*—Joseph J. Lauture
(74) *Attorney, Agent, or Firm*—Anthony M. Martinez

(57) ABSTRACT

A digital-to-analog conversion circuit including a plurality of unit current output cells (1) arranged in a matrix. Each of the current output cells (1) includes a unit current source (11) having a power supply input and a current output, and a selecting switch (12) connected to the current output and having two switching output terminals. The circuit further includes at least one ½ and/or ¼ weighted current output cell (2) disposed on a row in the matrix, and at least one ½ and/or ¼ supplementary current source (8) disposed on a desired row so that the total current consumption of the unit, weighted and supplementary current sources on each row is substantially the same. A decoder responds to a digital signal to control the switching of the selecting switches one by one as the digital signal gradually increases.

5 Claims, 5 Drawing Sheets

DIGITAL-TO-ANALOG CONVERSION CIRCUIT

TECHNICAL FIELD

This invention relates generally to a digital-to-analog (D/A) conversion circuit using a plurality of current cells.

BACKGROUND OF THE INVENTION

A current output-type digital-to-analog (D/A) conversion circuit is well known in this art. A portion of a typical example of such D/A conversion circuit for 8 bit data is shown in FIG. 2. The D/A conversion circuit has a matrix arrangement of sixty-three unit current cells 1, and two weighted current cells (binary cells) 2 and 3 each having a binary weight. Fifteen unit current cells can give an analog output corresponding to four bit data. Thirty-one unit current cells can give an analog output corresponding to five bit data. Sixty-three unit current cells can give an analog output corresponding to 6 bit data. Because the D/A converter further includes the ½ weighted current cell 2 and the ¼ weighted current cell 3, it can give an analog output corresponding to the 8 bit data. In this matrix arrangement, cells are numbered (0), (1), (2), (3), (4), ... (16) from left to right.

Each unit current cell 1 includes a unit current source 11 and a selecting switch 12. The weighted current cells 2 and 3 located at the number (8) each include a weighted current source 21 and 31 respectively and a selecting switch 12. In FIG. 2, such reference numerals are indicated only for the upper and leftmost current source cell (0). The unit and weighted current sources 11, 21 and 31 on each row are sequentially connected to a power supply terminal 100 in parallel through each of power supply lines 101–104. The selecting switch 12 selectively connects the current sources 11, 21 and 31 to a lead line 301 or 201, that is respectively connected to a first and second output terminal 300 and 200. A decoder (not shown) responds to a digital signal input and controls the switching of the selecting switches 12 in a manner where the decoder switches the selecting switches one by one left to right when the digital signal gradually increases. Each of the first and second output terminals 300 and 200 externally supplies analog output current in a complementary manner. With the D/A conversion circuit so configured, each of the unit and weighted current sources 11, 21 and 31 is connected to either of the first and second output terminals 300 and 200 according to an input digital code. Thus, a current of the magnitude corresponding to the input digital data flows through the first and second output terminals 300 and 200, so that D/A conversion is performed.

In more detail of this prior art example, as the most-significant six bits of input digital data increase, the selecting switches 12 of the unit current source cells 1 are sequentially operated to connect each unit current source 11 to either of the first and second output terminals 300 and 200. Depending on the state of the second least significant bit of the input digital data, the selecting switch 12 of the ½ current source cell 2 is operated to connect the ½ current source 21 to either of the first and second output terminals 300 and 200. Furthermore, depending on the state of the least significant bit of the input digital data, the selecting switch 12 of the ¼ current source cell 3 is operated to connect the ¼ current source 31 to either of the first and second output terminals 300 and 200. Thus, a current of magnitude corresponding to the input eight bit digital data flows through the first and second output terminals 300 and 200, so that 8 bit D/A conversion can be performed.

Rows, or vertical positions, are denoted by alphabets, (a), (b), (c), and (d) as shown in FIG. 2. Columns, or horizontal positions, are similarly denoted by numerals, (0), (1), (2), (3), (4), and so forth. To identify or address a specific one of the current cells arranged in the matrix form, it is denoted in combination of such row alphabet and column number. For example, a cell located at the lower right corner in the figure is denoted by (d16). To address all the cells in a row or all the cells in a column, they are denoted by using asterisk mark, *, such as (*1) or (a*). Alternately, they may be simply denoted by (1) or (a).

The unit and weighted current cells 1, 2, 3 arranged in 4 rows by 16 columns of the prior art current output-type D/A conversion circuit are connected to each other in horizontal direction by the power supply lines 101–104, and further connected to one terminal pad 100 by power supply lines 105–108. The unit current source s11 and binary current sources 21 and 31 are all driven by a common bias-voltage power supply, and therefore the current value outputted by each of the unit current sources 11 and binary current sources 21 and 31 is dependent upon the power supply voltage applied thereto. Because metal wires of the power supply lines 101–108 have significant resistances, the wires can be represented by an equivalent circuit as shown in FIG. 3, where wire resistances 400–467 exist along the analog power supply lines 101–108. Due to these wire resistances 400–467, a potential distribution occurs in each analog power supply line 101–104 such that the potential decreases from current source cell (16) to (0), as shown in FIG. 4. This potential distribution problem can be solved by selecting the current cells in specific order, that is explained in a co-assigned pending application SC0613AJ.

The unit current cells 1 are generally arranged regularly, while the binary current cells 2, 3 are located in excess space, in consideration of the characteristics of the semiconductor fabrication process. In FIG. 3, the first binary cell 2 is located at (a8), the second binary cell 3 is located at (b8), with no cell being placed at (c8), (d8) or (d0). Accordingly the total current amount of all the current sources on each row (a), (b), (c), (d) is different from each other, and the potential distributions along each analog power supply line 101–104 is not identical to each other even if the potential at the right end of each analog power supply line 101–104 is assumed to be the same. This potential distribution variation problem has not yet been solved in the prior art.

Thus, the bias conditions for the unit current sources 11 and binary current sources 21 and 31 are varied, and the output current of each of the unit current sources 11 differs depending on the position of its cell, as shown in FIG. 5. Consequently, the currents supplied externally from the output terminals 300 and 200 do not show precise integer multiples of the unit current source 11. And the first and second binary current sources 21 and 31 do not give precise ½, ¼ of the unit current. Therefore, a prior art D/A converter suffers a problem that its analog output corresponding to the digital input data is not ideal, resulting in degradation of linearity.

The present invention is intended to alleviate the above potential distribution problem and has its objective to provide a D/A conversion circuit with improved linearity.

DETAILED DESCRIPTION OF THE PREFERRED EMBODIMENT

Figure 1:
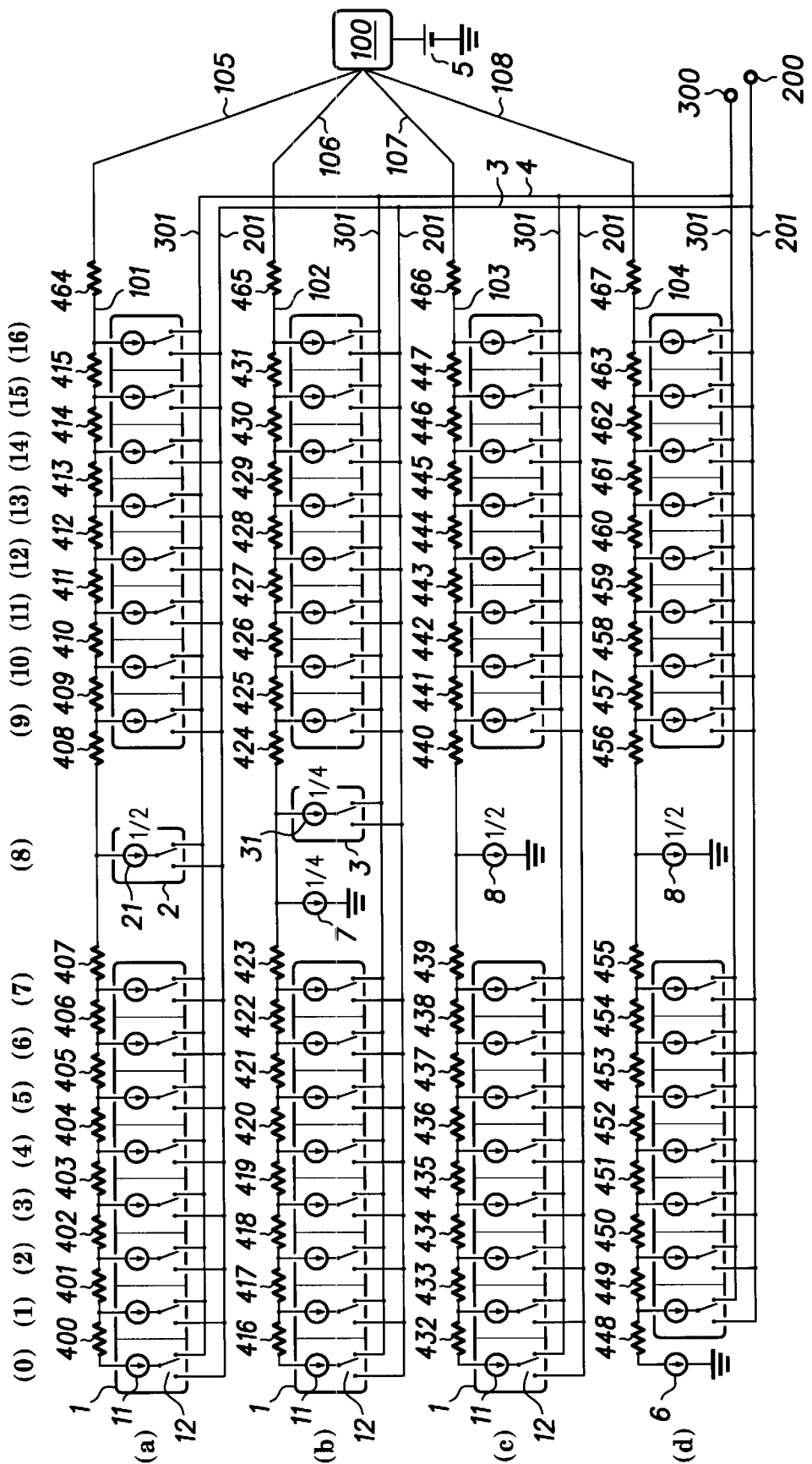
FIG. 1 is a schematic diagram illustrating a D/A conversion circuit according to an embodiment of the present invention.
Figure 2:
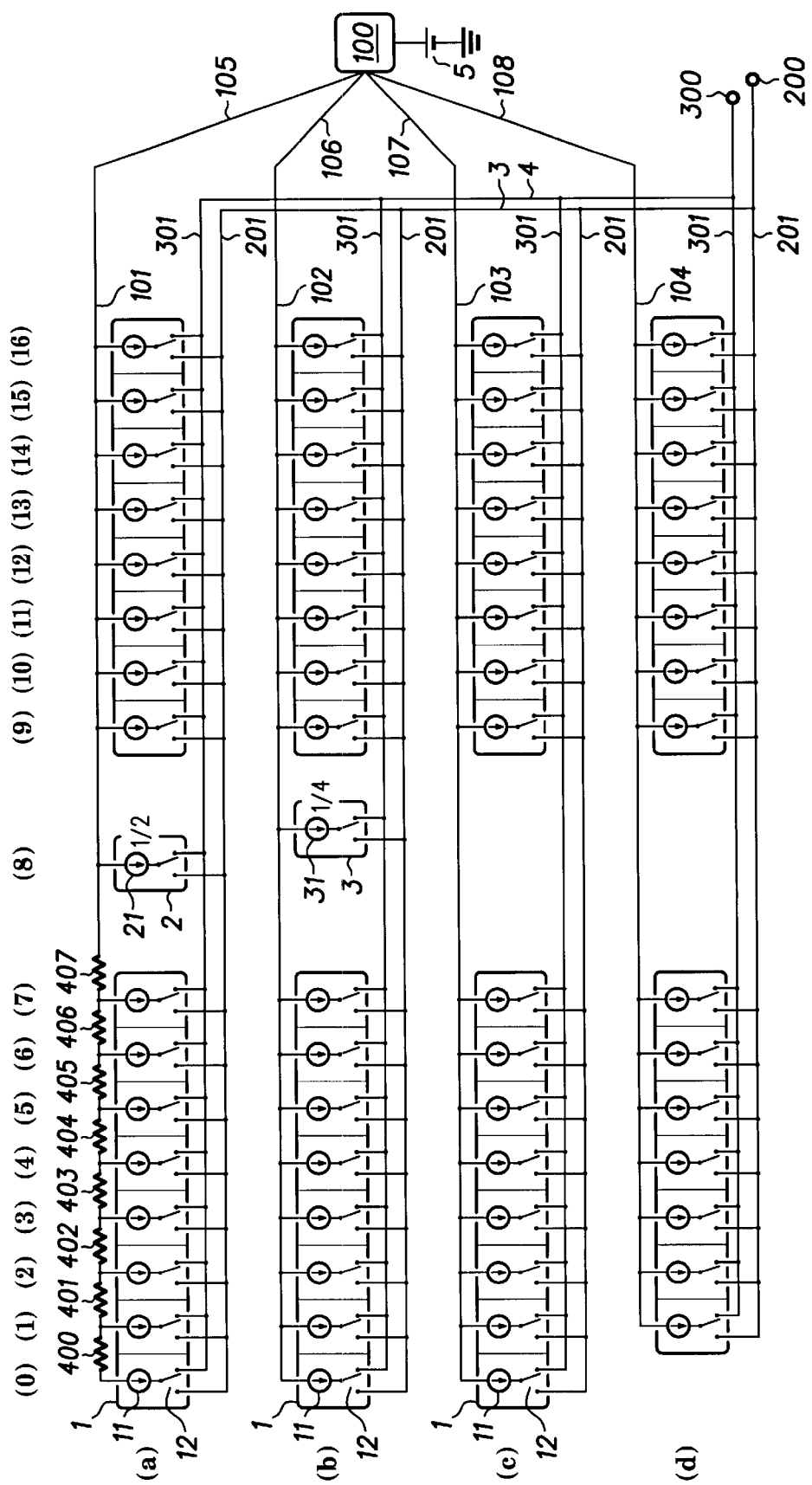
FIG. 2 is a schematic diagram illustrating a prior art D/A conversion circuit.

Referring to FIG. 1, a schematic diagram illustrating an arrangement of current source cells that comprises a portion of a current cell matrix-type D/A conversion circuit according to an embodiment of the present invention. The D/A conversion circuit includes an analog power supply terminal 100, analog power supply lines 101–108, and a plurality of unit current cells 1 and weighted current cells 2, 3 arranged in a matrix. Each unit current cell has a unit current source 11 and a selecting switch 12. The weighted current cell 2 has a selecting switch 12 and a weighted current source 21 giving ½ weighted current of the unit current amount. The weighted current cell 3 has a selecting switch 12 and a weighted current source 31 giving ¼ weighted current of the unit current amount. The D/A conversion circuit further includes output lead lines 301, 201, and output terminals 300, 200. A decoder (not shown) responds to the most significant six bits of a digital signal input and controls the switching of the selecting switches 12 of the unit current cells 1 in a manner where the decoder switches the selecting switches one by one in a desired order when the digital signal gradually increases. The decoder responds to the second least significant bit of the digital input data and operates the selecting switch 12 of the weighted current cell 2, and responds to the least significant bit of the digital input data and operates the selecting switch 12 of the weighted current cell 3. Such a decoder itself is understood in the art and need not be described in more detail here.

In this embodiment of the present invention, a unit current source 6 is added at (d0), two weighted current sources 8 each having one-half the weight of the unit current source are added at (c8) and (d8), and a weighted current source 7 having one-fourth weight is added at (b8) in parallel to the second binary cell 3, in order to ensure that the potential distribution on each of the power supply lines 101–104 is identical to each other. Thus, the resulting output current variation width is reduced as compared to the arrangement of FIG. 3.

Figure 3:
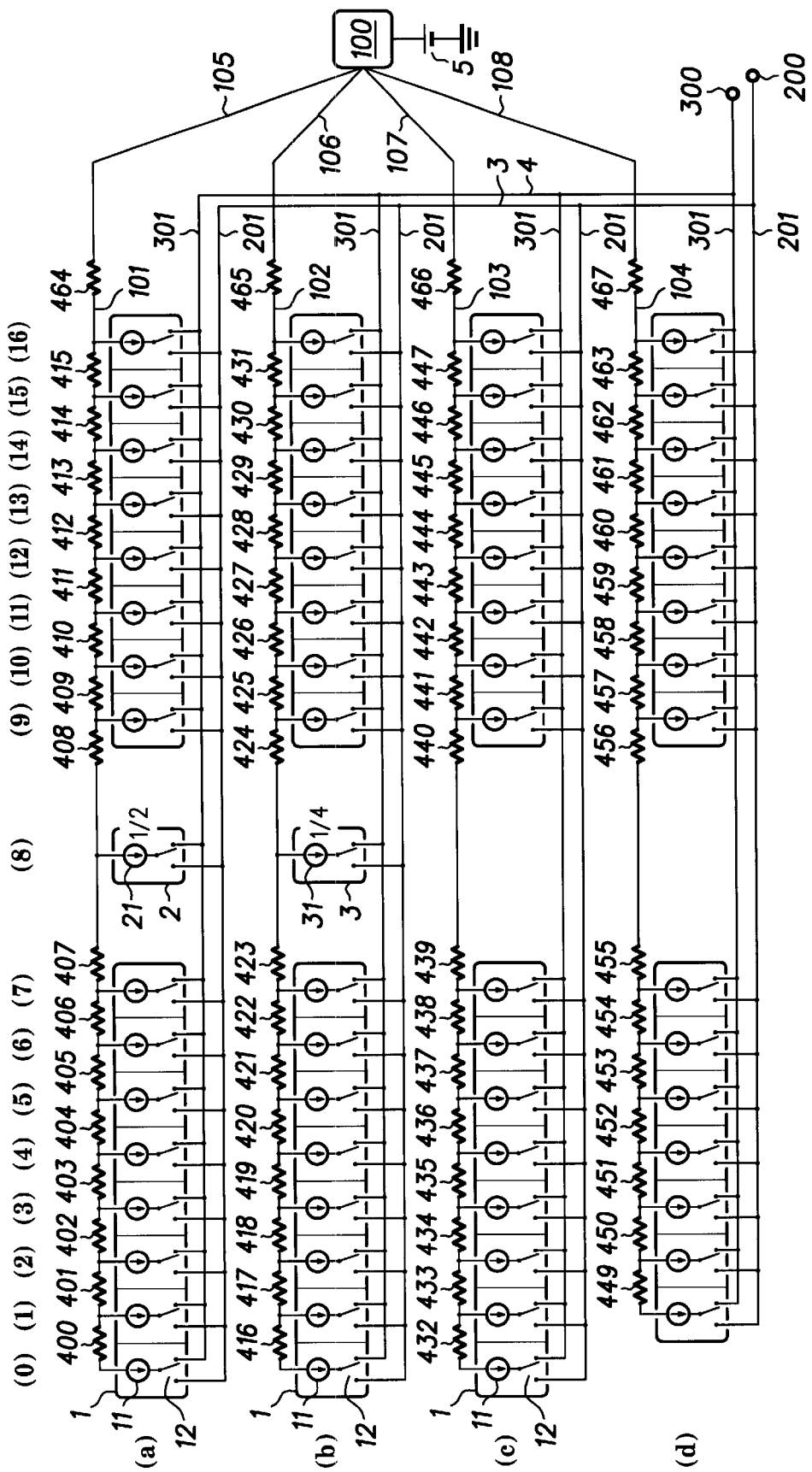
FIG. 3 is an equivalent circuit diagram of the prior art conversion circuit shown in FIG. 2.
Figure 4:
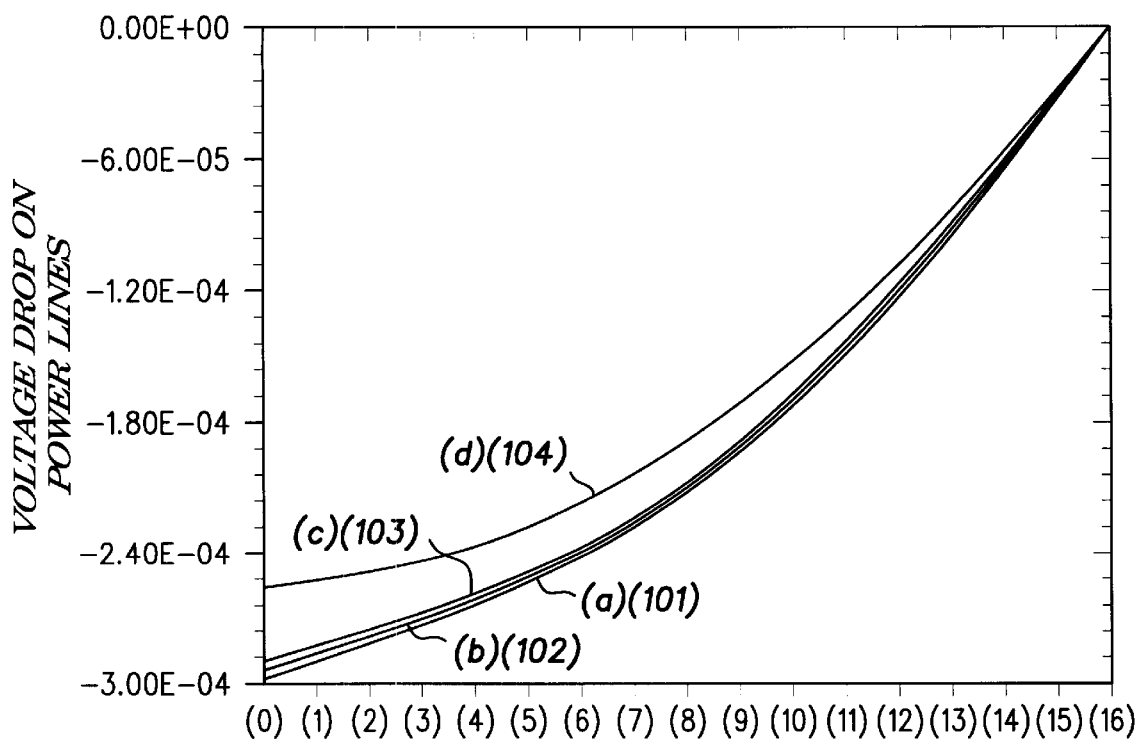
FIG. 4 is a chart illustrating calculation results for voltage drops on power supply lines 101–104 of the D/A conversion circuit shown in FIG. 3.
Figure 5:
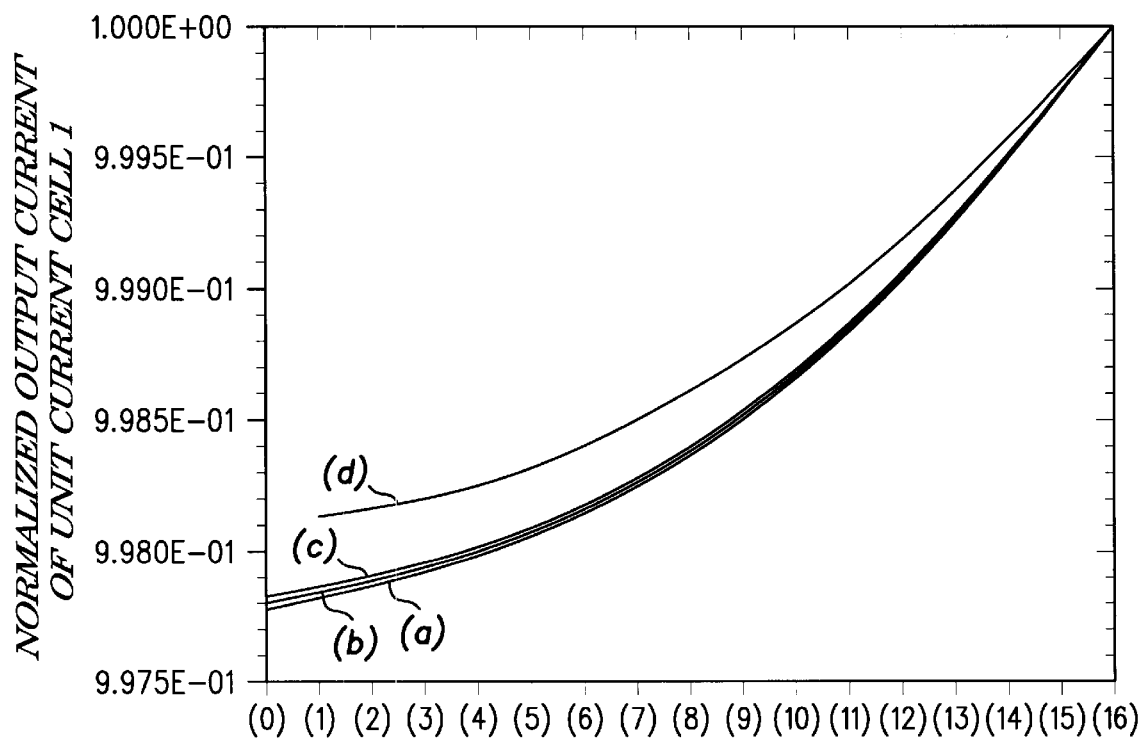
FIG. 5 is a chart illustrating calculation results for current outputs of each unit current source 1 on rows (a) to (d) of the D/A conversion circuit shown in FIG. 3.
Figure 6:
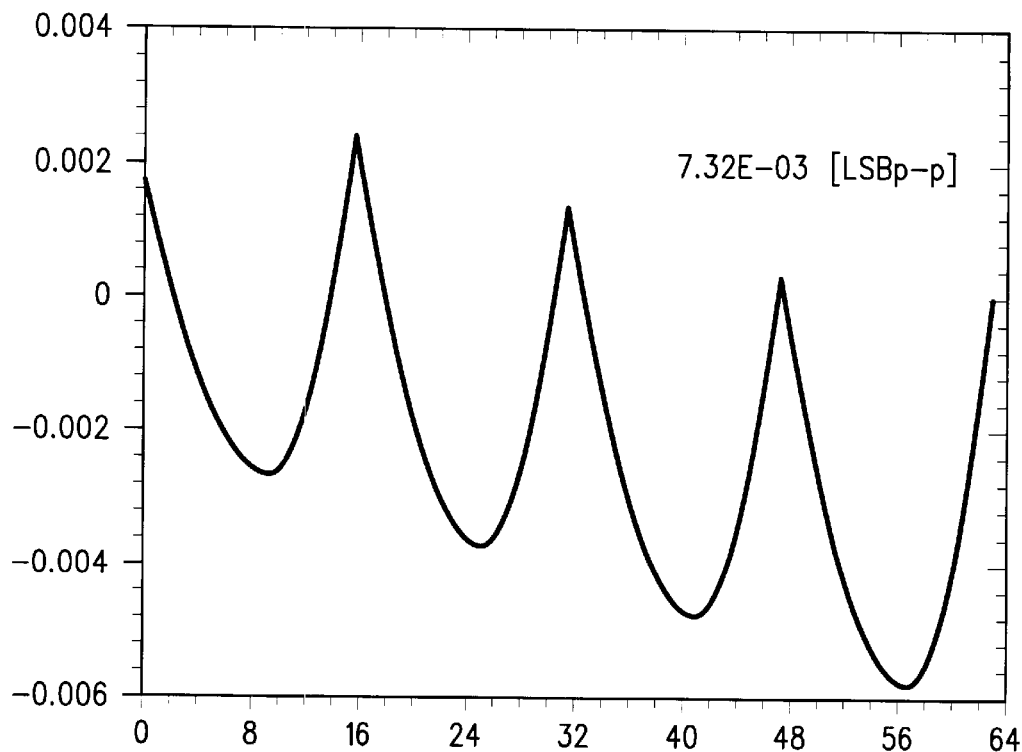
FIG. 6 is a chart illustrating calculation results for linearity errors of the D/A conversion circuit shown in FIG. 3.
Figure 7:
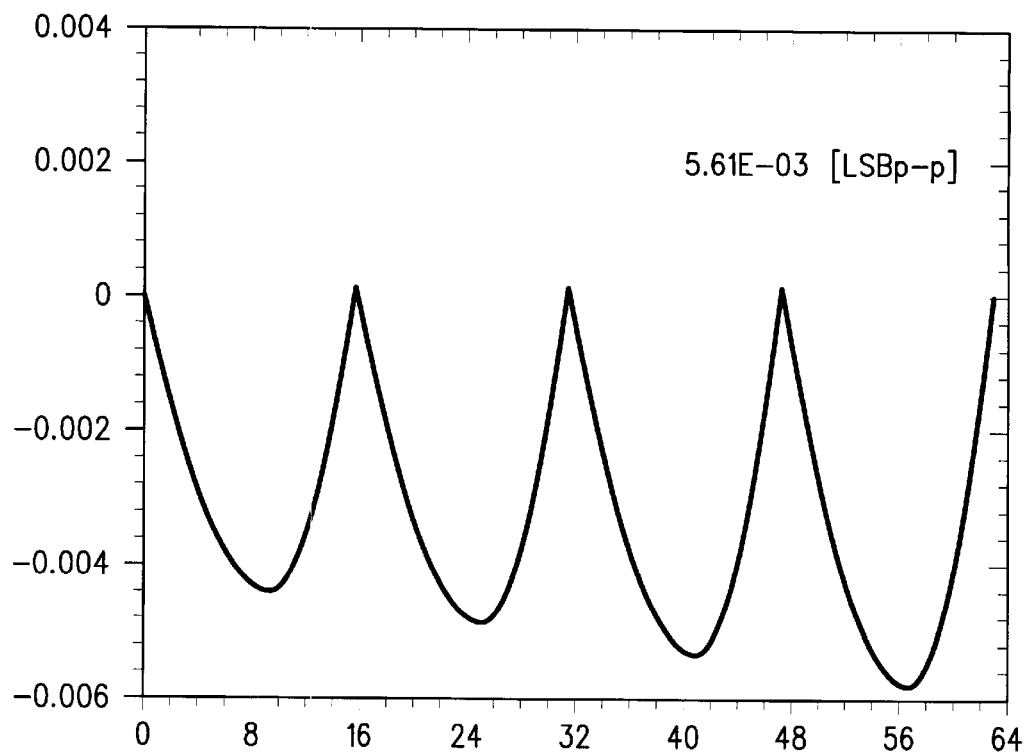
FIG. 7 is a chart illustrating calculation results for linearity errors of the embodiment circuit shown in FIG. 1.

FIG. 6 shows linearity error obtained in the arrangement of FIG. 3, and FIG. 7 shows linearity error obtained in the arrangement of FIG. 1. The linearity characteristic in FIG. 7 exhibits improvement over that in FIG. 6.

Although the present invention was explained using an 8-bit d/a having 2-bit binary cells in the above embodiment, the present invention can be applicable to any type of D/A converter having any number of matrix cells and any number of binary cell.

What is claimed is:

1. An apparatus comprising:

a plurality of unit current output cells arranged in a matrix having a plurality of groups, each of the current output cells comprising a unit current source having a power supply input and a current output, and a selecting switch connected to the current output and having at least one switching output terminal;

at least one weighted current output cell disposed at a desired place in a desired group of the groups in the matrix, the weighted current output cell comprising a weighted current source having a power supply input and a current output, and a selecting switch connected to the current output and having at least one switching output terminal, the weighted current source having a weight of Nth power of 2 relative to the unit current source;

at least one common output line connected to the switching output terminal of each of the selecting switches;

a decoder operably coupled to the unit and weighted current output cells;

a power supply terminal for supplying power to each of the unit and weighted current sources; and at least one supplementary current source disposed at a place in the matrix, so that the total current consumption of the unit, weighted and supplementary current sources in each group is substantially the same.

2. The apparatus of claim 1, wherein said at least one weighted current output cell comprises:

a ½ weighted current output cell including a weighted current source having a weight of ½ the unit current source.

3. The apparatus of claim 2, wherein said at least one supplementary source comprises:

a ½ supplementary source having a weight of ½ of the unit current source.

4. The apparatus of claim 3, wherein said at least one weighted current output cell further comprises:

a ¼ weighted current output cell including a weighted current source having a weight of ¼ of the unit current source.

5. The apparatus of claim 4, wherein the at least one supplementary sources further comprises:

a ¼ supplementary source having a weight of ¼ of the unit current source.

* * * * *